(12) United States Patent
Lin

(10) Patent No.: US 10,483,190 B2
(45) Date of Patent: Nov. 19, 2019

(54) THERMAL CONDUCTION STRUCTRURE AND MANUFACTURING METHOD THEREOF

(71) Applicant: TAIWAN MICROLOOPS CORP., New Taipei (TW)

(72) Inventor: Chun-Hung Lin, New Taipei (TW)

(73) Assignee: TAIWAN MICROLOOPS CORP., New Taipei (TW)

( * ) Notice: Subject to any disclaimer, the term of this patent is extended or adjusted under 35 U.S.C. 154(b) by 84 days.

(21) Appl. No.: 15/614,615

(22) Filed: Jun. 6, 2017

(65) Prior Publication Data

US 2018/0350718 A1    Dec. 6, 2018

(51) Int. Cl.
*H01L 23/427*    (2006.01)
*H01L 23/433*    (2006.01)
*H01L 21/48*    (2006.01)

(52) U.S. Cl.
CPC ........ *H01L 23/427* (2013.01); *H01L 21/4882* (2013.01)

(58) Field of Classification Search
CPC ........................... H01L 23/427; H01L 21/4882
USPC .................................................... 165/104.33
See application file for complete search history.

(56) References Cited

U.S. PATENT DOCUMENTS

| | | | |
|---|---|---|---|
| 2003/0094274 A1* | 5/2003 | Toth | F28F 1/128 165/183 |
| 2005/0173098 A1 | 8/2005 | Connors | |
| 2010/0157535 A1* | 6/2010 | Oniki | F28D 15/0233 361/700 |
| 2015/0176916 A1* | 6/2015 | Pai | F28D 15/0233 165/104.26 |
| 2016/0348985 A1 | 12/2016 | Sun et al. | |

FOREIGN PATENT DOCUMENTS

| CN | 101079403 A | 11/2007 |
|---|---|---|
| CN | 100470776 C | 3/2009 |
| CN | 203177703 U | 9/2013 |

(Continued)

OTHER PUBLICATIONS

English translation CN205093079 (Year: 2016).*

(Continued)

*Primary Examiner* — Joel M Attey
(74) *Attorney, Agent, or Firm* — Chun-Ming Shih; HDLS IPR Services

(57) ABSTRACT

In a thermal conduction structure and its manufacturing method, the thermal conduction structure includes a vapor chamber, a heat pipe and a working fluid. The vapor chamber includes an upper casing, a lower casing, and a cavity formed between the lower and upper casings. The upper casing has a through hole communicated with the cavity and a first capillary tissue disposed on the internal surface of the upper casing. The first capillary tissue has a penetrating hole corresponsive to the through hole. The heat pipe includes a tube and a second capillary tissue disposed in the tube and extended out from the tube to define an exposed section, and the heat pipe is passed and coupled to the through hole, and the exposed section is passed through the penetrating hole to attach to the first capillary tissue. The working fluid is filled in the cavity.

7 Claims, 6 Drawing Sheets

(56) References Cited

FOREIGN PATENT DOCUMENTS

| | | | | |
|---|---|---|---|---|
| CN | 205093079 | * | 3/2016 | ............... H05K 7/20 |
| CN | 106288891 A | | 1/2017 | |
| CN | 206847446 U | | 1/2018 | |
| JP | H1062080 A | | 3/1998 | |
| TW | 201510460 A | | 3/2015 | |
| TW | M517314 U | | 2/2016 | |

OTHER PUBLICATIONS

Office Action dated Jul. 17, 2017 of the corresponding Taiwan patent application.
Office Action dated Jun. 19, 2019 of the corresponding China patent application.

* cited by examiner

THERMAL CONDUCTION STRUCTRURE AND MANUFACTURING METHOD THEREOF

FIELD OF THE INVENTION

This disclosure relates to a thermal conduction technology, and more particularly to a thermal conduction structure and its manufacturing method.

BACKGROUND OF THE INVENTION

As the computing speed of electronic devices increases, more and more heat will be generated by the electronic device. To overcome the large amount of generated heat effectively, related manufacturers uses heat pipes and vapor chambers with good thermal conductivity extensively. Although the heat pipes contain a gaseous working fluid with consistent flowing direction, yet the amount of the conduct heat is very small due to the limitation of the volume of the heat pipes. On the other hand, although the vapor chambers have a spacious heated area provided to be attached to a heat source for heat conduction, yet the flow of the gaseous working fluid is chaotic and the thermal conduction and dissipation effects are very limited.

To overcome the aforementioned problems, some manufacturers further combine the heat pipe with the vapor chamber to form a thermal conduction structure, whose manufacturing process is described below: Firstly, a casing plate of the vapor chamber is soldered with the heat pipe, and then a core rod is inserted and a metal powder is filled, and the casing plate of the vapor chamber is sent to a heating device for sintering, and then the core rod is removed from the heat pipe, and finally a subsequent process such as the process sealing with another casing plate of the vapor chamber is perform to produce a thermal conduction structure.

Although the conventional thermal conduction structure has the thermal conduction and dissipation effects, it still has the following drawbacks. Since the manufacturing process is very complicated, the complicated process is unfavorable for mass production. In addition, the core rod is extended to the bottom end (which is a closed end) of the heat pipe, and thus it is difficult to remove the core rod from the heat pipe after the sintering process is finished. In addition, the core rod is attached to a capillary tissue with a large area, so that the capillary tissue may be damaged or cracked during the process of removing the core rod, and the yield rate of the product will be poor.

In view of the aforementioned drawbacks of the prior art, the discloser of this disclosure conducted extensive research and provided a feasible design to overcome the drawbacks of the prior art.

SUMMARY OF THE INVENTION

Therefore, it is a primary objective of the present invention to provide a thermal conduction structure and its manufacturing method, wherein a vapor chamber and a heat pipe are manufactured separately, and then the heat pipe is inserted and coupled to the vapor chamber directly, so as to improve the ease of production and apply the manufacturing method for a fast mass production.

To achieve the aforementioned and other objectives, this disclosure provides a this disclosure a thermal conduction structure comprising: a vapor chamber, including an upper casing, a lower casing sealed and engaged with the upper casing, and a cavity formed between the lower casing and the upper casing, and the upper casing having a through hole communicated with the cavity, and a first capillary tissue being disposed on the internal surface of the upper casing, and the first capillary tissue having a penetrating hole formed thereon and configured to be corresponsive to the through hole; a heat pipe, including a tube and a second capillary tissue, and the second capillary tissue being disposed in the tube, and further extended out from the tube to define an exposed section, and the heat pipe being passed and coupled to the through hole, and the exposed section being passed through the penetrating hole to attach to the first capillary tissue; and a working fluid, filled in the cavity.

To achieve the aforementioned and other objectives, this disclosure provides a thermal conduction structure manufacturing method, comprising the steps of: (a) preparing an upper casing, and manufacturing the upper casing to form a through hole on the upper casing; (b) preparing a first capillary tissue with a penetrating hole configured to be corresponsive to the through hole; (c) disposing the first capillary tissue on a surface of the upper casing, and configuring the penetrating hole to be aligned precisely with the through hole; (d) preparing a lower casing sealed and engaged with the upper casing, such that a cavity is formed between the upper casing and the lower casing; (e) preparing a heat pipe having a tube and a second capillary tissue, and the second capillary tissue being disposed in the tube and extended out from the tube to define an exposed section; (f) passing and connecting the heat pipe to the through hole for sealing, and passing the exposed section through the penetrating hole to attach to the first capillary tissue; and (g) applying a filling liquid and a degassing and sealing process to the semi-finished product of Step (f).

This disclosure has the following effects. The first capillary tissue and the second capillary tissue are contacted to improve the reflow speed of the working fluid. The penetrating hole has the dividing lines, so that the edge of the penetrating hole may be bent and deformed easily to produce the bending deformation which is favorable for passing through the exposed section and achieve a larger attaching and contacting area.

DESCRIPTION OF THE PREFERRED EMBODIMENTS

The technical contents of the present invention will become apparent with the detailed description of preferred embodiments accompanied with the illustration of related drawings as follows. It is noteworthy that the preferred embodiments are provided for illustrating this disclosure rather than restricting the scope of the disclosure.

Figure 1:
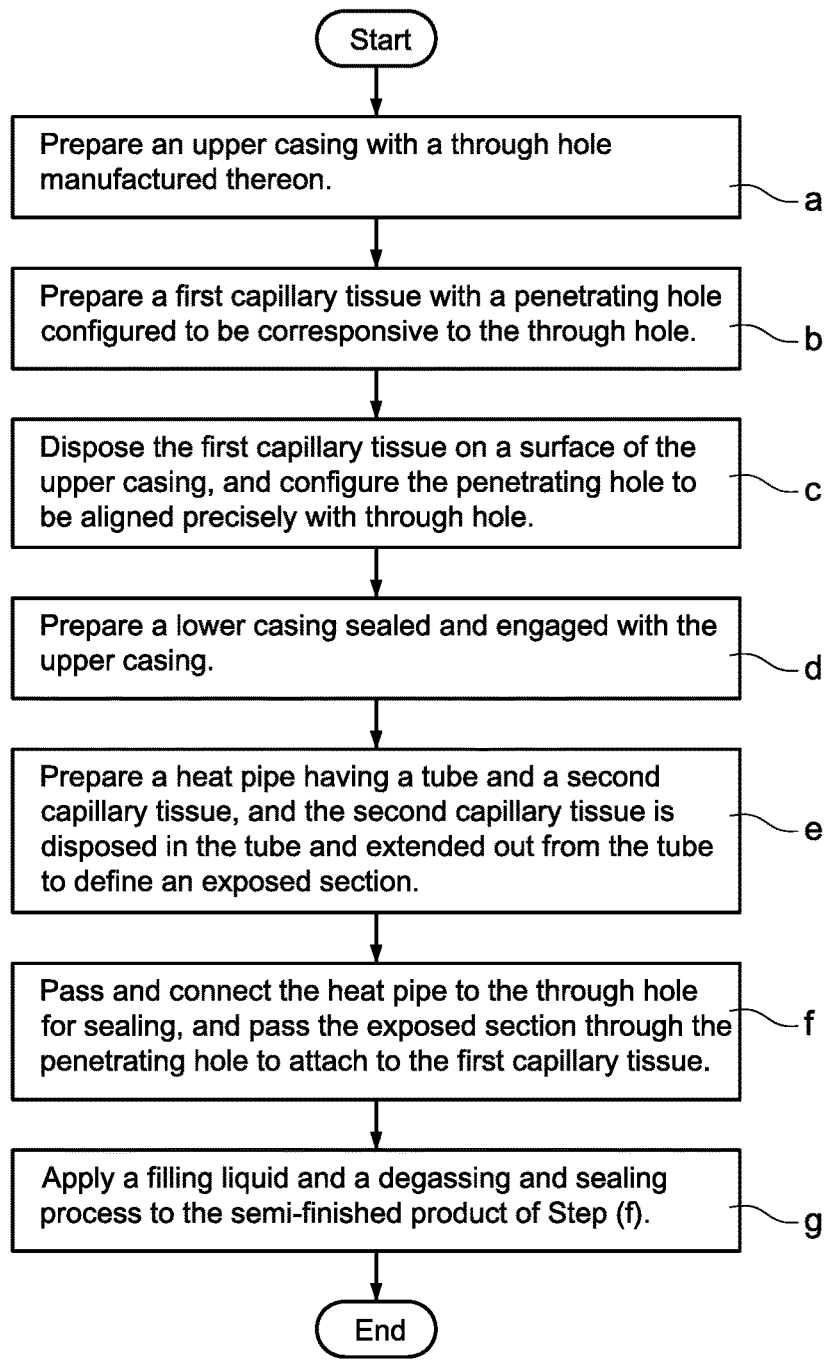
FIG. 1 is a flow chart of a manufacturing method of a thermal conduction structure of this disclosure.
Figure 2:
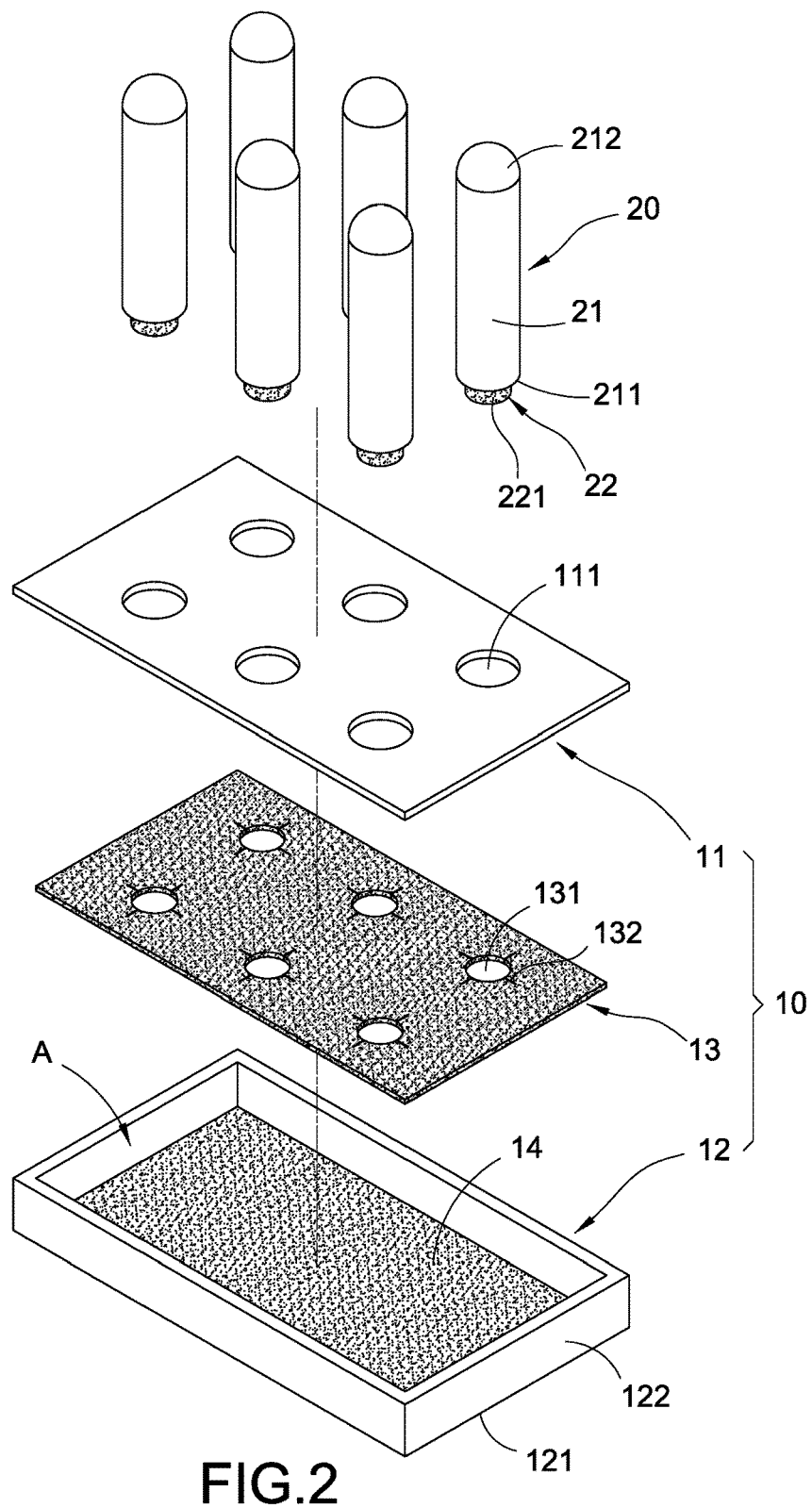
FIG. 2 is an exploded view of a thermal conduction structure of this disclosure.
Figure 3:
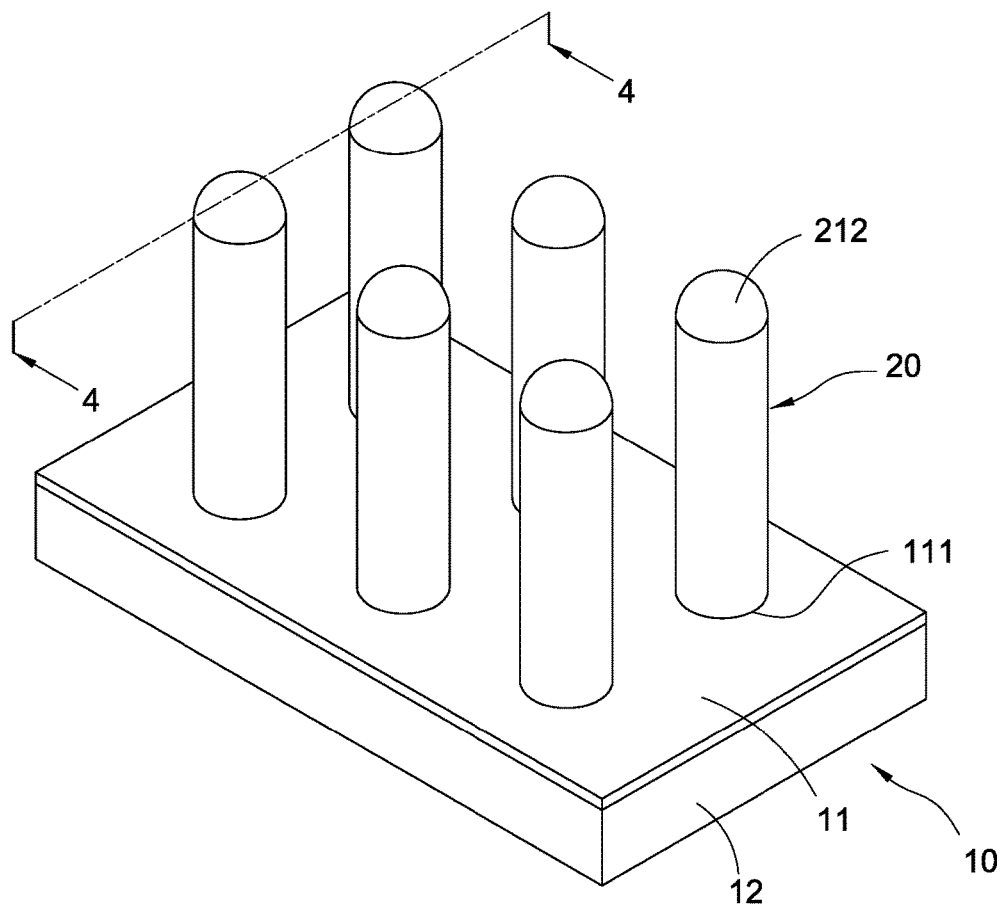
FIG. 3 is a perspective view of a thermal conduction structure of this disclosure.

With reference to FIGS. 1 to 4 for a thermal conduction structure manufacturing method of this disclosure, the method comprises the following steps:

(a) Prepare an upper casing 11, and manufacture the upper casing 11 to form a through hole 111 thereon. With reference to FIG. 2, the upper casing 11 may be made of aluminum, copper or their alloy, and a forming mold (not shown in the figure) is used to stamp and manufacture the upper casing 11 to form a plurality of through holes 111 on the upper casing 11. The quantity of through holes 111 may be selected according to actual requirements. For example, one through hole 111 may be selected for a micro heat sink.

Figure 5:
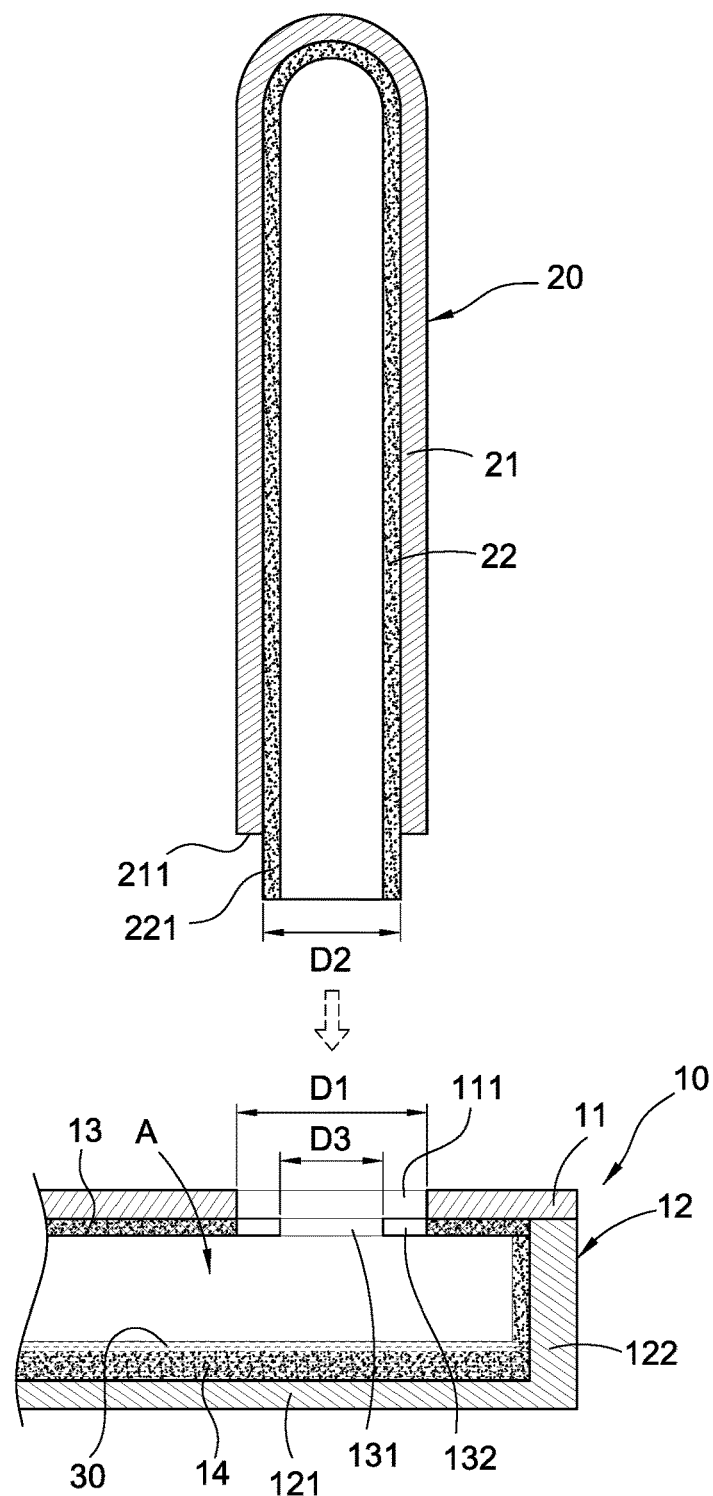
FIG. 5 is another cross-sectional view of Section 4-4 of FIG. 3.
Figure 6:
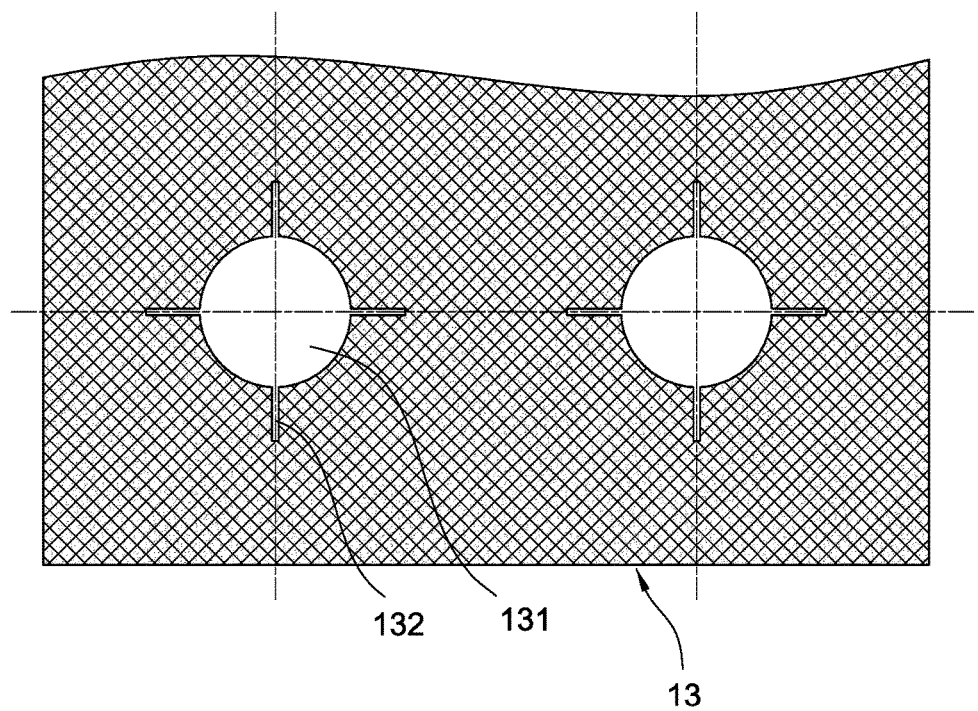
FIG. 6 is a top view of the first capillary tissue

(b) Prepare a first capillary tissue 13 with a penetrating hole 131 configured to be corresponsive to the through hole 111. With reference to FIG. 2, the first capillary tissue 13 may be a braided metal mesh, and a forming mold (not shown in the figure) is used to punch and form holes on the first capillary tissue 13, so that the first capillary tissue 13 has a plurality of penetrating holes 131 formed thereon, and the quantity of penetrating holes 131 is corresponsive to the quantity of through holes 111, and the internal diameter of the penetrating hole 131 (D3 as shown in FIG. 5) is smaller than the internal diameter of the through hole 111 (D1 as shown in FIG. 5). In addition, with reference to FIG. 6, the penetrating hole 131 has a plurality of dividing lines 132 formed on the center line of the penetrating hole 131, and the dividing lines 132 are arranged substantially in a cross which is favorable for bending and deforming the edge of the penetrating hole 131 to produce a bending deformation.

Figure 4:
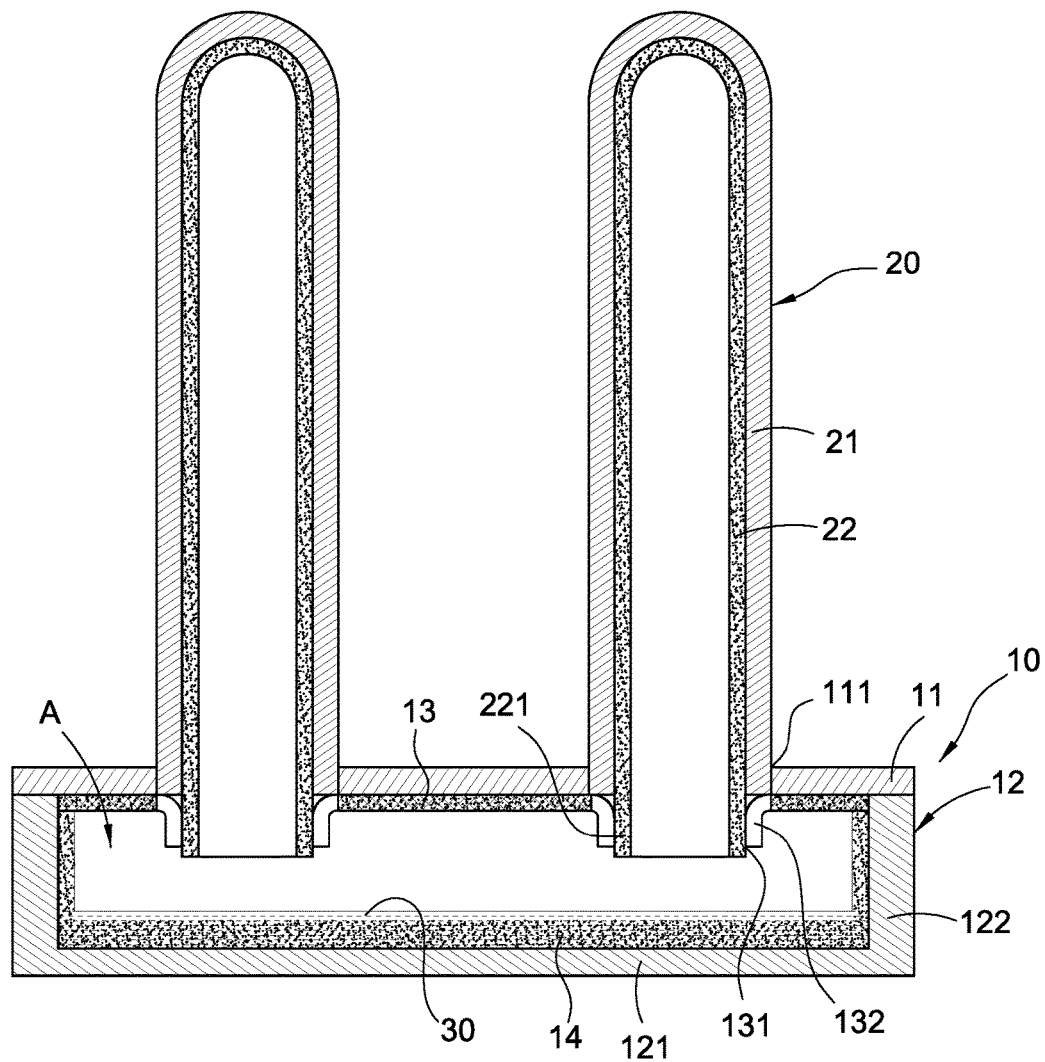
FIG. 4 is a cross-sectional view of Section 4-4 of FIG. 3.

(c) Dispose the first capillary tissue 13 on a surface of the upper casing 11, and configure the penetrating hole 131 to be aligned precisely with through hole 111. With reference to FIG. 4, the penetrating hole 131 of the first capillary tissue 13 is aligned precisely with the through hole 111 of the upper casing 11 and they are fixed with each other by soldering or any other fixing method, so that the first capillary tissue 13 is securely combined with the internal surface of the upper casing 11.

(d) Prepare a lower casing 12 sealed and engaged with the upper casing 11, such that a cavity A is formed between the upper casing 11 and the lower casing 12. With reference to FIG. 4, the lower casing 12 is pre-manufactured to form a cavity and a third capillary tissue 14 disposed in the cavity, wherein the third capillary tissue 14 may be a braided metal mesh, a porous powder sintered substance or a groove, and the lower casing 12 is soldered and engaged with the upper casing 11, such that a cavity A is formed between the upper casing 11 and the lower casing 12.

(e) Prepare a heat pipe 20 having a tube 21 and a second capillary tissue 22, wherein the second capillary tissue 22 is disposed in the tube 21 and extended out from the tube 21 to define an exposed section 221. With reference to FIG. 2, the quantity of heat pipes 20 is equal to the quantity of through holes 111 as well as the quantity of penetrating holes 131, and the tube 21 has an open end 211 and a closed end 212, and the second capillary tissue 22 may be a braided metal mesh, a porous powder sintered substance or a groove and extended from the closed end 212a to the open end 211 of the tube 21, and the second capillary tissue 22 is extended out from the open end 211 of the tube 21 to define an exposed section 221, and the internal diameter of the penetrating hole 131 is smaller than the external diameter of the exposed section 221.

(f) Pass and connect the heat pipe 20 to the through hole 111 for sealing, and pass the exposed section 221 through the penetrating hole 131 to attach to the first capillary tissue 13. With reference to FIG. 4, the semi-finished product of the heat pipe 20 and the semi-finished product of the vapor chamber 10 are assembled, and an end of the heat pipe 20 having the exposed section 221 is aligned precisely with the through hole 111 of the upper casing 11 and sealed by soldering. Since the internal diameter of the penetrating hole 131 is smaller than the external diameter of the exposed section 221 (D2 as shown in FIG. 5), the edge of the penetrating hole 131 is bent and deformed easily to produce a bending deformation and stacked with the external surface of the exposed section 221, when the exposed section 221 of the heat pipe 20 is passed through the penetrating hole 131.

(g) Apply a filling liquid and a degassing and sealing process to the semi-finished product of Step (f). With reference to FIG. 4, a liquid such as water may be used as the working fluid 30 and filled into the cavity A by an infusion and degassing tube (not shown in the figure), and the subsequent processes including the degassing and sealing process are carried out to finish the manufacture of the thermal conduction structure of this disclosure.

With reference to FIG. 4 for a thermal conduction structure of this disclosure, the thermal conduction structure comprises a vapor chamber 10, a heat pipe 20 and a working fluid 30. The vapor chamber 10 includes an upper casing 11, a lower casing 12 sealed and engaged with the upper casing 11, and a cavity A is formed between the lower casing 12 and the upper casing 11. The upper casing 11 has a through hole 111 formed thereon and communicated with the cavity A, a first capillary tissue 13 disposed on the internal surface of the upper casing 11, and a penetrating hole 131 formed on the first capillary tissue 13 and configured to be corresponsive to the through hole 11. The heat pipe 20 includes a tube 21 and a second capillary tissue 22, and the second capillary tissue 22 is disposed in the tube 21 and extended out from the tube 21 to define an exposed section 221, and the heat pipe 20 is passed and connected to the through hole 111, and the exposed section 221 is passed through the penetrating hole 131 and stacked with the first capillary tissue 13. The working fluid 30 is filled in the cavity A.

In summation of the description above, this disclosure achieves the expected effects, overcomes the drawbacks of the prior art, and complies with the patent application requirements, and thus is duly filed for patent application. While the invention has been described by means of specific embodiments, numerous modifications and variations could be made thereto by those skilled in the art without departing from the scope and spirit of the invention set forth in the claims.

What is claimed is:

1. A thermal conduction structure, comprising:
   a vapor chamber, including an upper casing, a lower casing sealed and engaged with the upper casing, and a cavity formed between the lower casing and the upper casing, and the upper casing having at least one through hole communicated with the cavity, and a first capillary tissue being disposed on the internal surface of the upper casing, and the first capillary tissue being a braided metal mesh having at least one penetrating hole formed thereon and configured to be corresponsive to the at least one through hole, and a plurality of dividing lines formed around an outer periphery of the at least one penetrating hole;
   at least one heat pipe, including a tube and a second capillary tissue, the tube having an open end and a closed end, and the second capillary tissue being coated on an inner surface of the tube without filling the tube, and further extended out from the tube to define an exposed section; after the at least one heat pipe being passed through and coupled to the at least one through hole, the exposed section being passed through the at least one penetrating hole to force the first capillary tissue around the periphery of the at least one penetrating hole to bend and deform to be against the exposed section; and a working fluid, filled in the cavity;

wherein an inner surface of the lower casing has a third capillary tissue disposed thereon, the exposed section is inserted into the cavity without contacting the third capillary tissue; and wherein a bottom surface of the tube at the open end is coplanar with an inner side of a top surface of the upper casing, so the tube is not inserted inside the vapor chamber.

2. The thermal conduction structure of claim 1, wherein the at least one penetrating hole has an internal diameter smaller than the internal diameter of the through hole.

3. The thermal conduction structure of claim 1, wherein the dividing lines are arranged substantially in a cross shape.

4. The thermal conduction structure of claim 1, wherein the second capillary tissue is a braided metal mesh or a porous powder sintered substance.

5. The thermal conduction structure of claim 1, wherein the at least one through hole and the at least one penetrating hole are-corresponsive to each other, and the quantity of the at least one heat pipe is equal to the quantity of the at least one through hole as well as the quantity of the at least one penetrating hole.

6. The thermal conduction structure of claim 1, wherein the at least one penetrating hole has an internal diameter smaller than the external diameter of the exposed section prior to being passed through and coupled together.

7. A thermal conduction structure manufacturing method for manufacturing the thermal conduction structure as claimed in claim 1, comprising the steps of:

(a) preparing an upper casing, and manufacturing the upper casing to form a through hole on the upper casing;

(b) preparing a first capillary tissue with a penetrating hole configured to be corresponsive to the through hole;

(c) disposing the first capillary tissue on a surface of the upper casing, and configuring the penetrating hole to be aligned precisely with the through hole;

(d) preparing a lower casing sealed and engaged with the upper casing, such that a cavity is formed between the upper casing and the lower casing;

(e) preparing a heat pipe having a tube and a second capillary tissue, and the second capillary tissue being disposed in the tube and extended out from the tube to define an exposed section;

(f) passing and connecting the heat pipe to the through hole for sealing, and passing the exposed section through the penetrating hole to attach to the first capillary tissue; and (g) applying a filling liquid and a degassing and sealing process to the semi-finished product of Step (f).

* * * * *